United States Patent [19]

Beinglass

[11] Patent Number: 5,141,892
[45] Date of Patent: Aug. 25, 1992

[54] PROCESS FOR DEPOSITING HIGHLY DOPED POLYSILICON LAYER ON STEPPED SURFACE OF SEMICONDUCTOR WAFER RESULTING IN ENHANCED STEP COVERAGE

[75] Inventor: Israel Beinglass, Sunnyvale, Calif.

[73] Assignee: Applied Materials, Inc., Santa Clara, Calif.

[21] Appl. No.: 785,189

[22] Filed: Oct. 31, 1991

Related U.S. Application Data

[63] Continuation of Ser. No. 572,280, Jul. 16, 1990, abandoned.

[51] Int. Cl.⁵ .......................................... H01L 21/225
[52] U.S. Cl. ..................................... 437/162; 437/110; 437/233; 437/160
[58] Field of Search ................ 437/110, 160, 162, 233

[56] References Cited

U.S. PATENT DOCUMENTS

| | | | |
|---|---|---|---|
| 4,249,968 | 2/1981 | Gardiner et al. | 437/162 |
| 4,507,349 | 4/1985 | Shinozaki | 437/162 |
| 4,829,024 | 5/1989 | Klein et al. | 437/193 |
| 4,830,972 | 5/1989 | Hamasaki | 437/162 |
| 4,977,104 | 12/1990 | Sawada et al. | 437/162 |
| 5,679,306 | 7/1987 | Shimizu | 437/162 |

FOREIGN PATENT DOCUMENTS

| | | | |
|---|---|---|---|
| 53-055986 | 5/1978 | Japan | 437/162 |
| 63-186423 | 8/1988 | Japan | 437/162 |

OTHER PUBLICATIONS

S. Wolf et al., *Silicon Processing for the VLSI Era*, Lattice Press, Sunset Beach, 1986 pp. 30 7-8.

*Primary Examiner*—Brien E. Hearn
*Assistant Examiner*—Laura M. Holtzman
*Attorney, Agent, or Firm*—John P. Taylor

[57] ABSTRACT

A polysilicon deposition process is disclosed for forming a doped polysilicon layer over a stepped surface on a semiconductor wafer having the deposition characteristics and resulting profile of an undoped polysilicon layer which comprises: depositing doped polysilicon on the stepped surface, depositing undoped polysilicon over the doped polysilicon, repeating the doped and undoped depositions cyclically until the desired amount of polysilicon has been deposited, and then annealing the deposited polysilicon to uniformly distribute the dopant throughout the entire deposited polysilicon layer.

20 Claims, 4 Drawing Sheets

```
┌─────────────────────────────────────────┐
│ FORMING A DOPED POLYSILICON LAYER HAVING│
│   THE DEPOSITION CHARACTERISTICS OF AN  │
│     UNDOPED POLYSILICON LAYER OVER A    │
│   STEPPED SURFACE OF A SEMICONDUCTOR    │
└─────────────────────────────────────────┘
                     │
                     │
┌─────────────────────────────────────────┐
│      DEPOSITING DOPED POLYSILICON ON    │
│    THE STEPPED SURFACE OF THE WAFER     │
│       FOR ABOUT 45 TO ABOUT 60 SECONDS  │
└─────────────────────────────────────────┘
                     │
┌─────────────────────────────────────────┐
│     DEPOSITING UNDOPED POLYSILICON ON   │
│     THE STEPPED SURFACE OF THE WAFER    │
│      FOR ABOUT 45 TO ABOUT 75 SECONDS   │
└─────────────────────────────────────────┘
                     │
┌─────────────────────────────────────────┐
│   ANNEALING THE DEPOSITED POLYSILICON   │
│   TO UNIFORMLY DISTRIBUTE THE DOPANT    │
│    THROUGHOUT THE POLYSILICON LAYER     │
└─────────────────────────────────────────┘
```

FIGURE 10

PROCESS FOR DEPOSITING HIGHLY DOPED POLYSILICON LAYER ON STEPPED SURFACE OF SEMICONDUCTOR WAFER RESULTING IN ENHANCED STEP COVERAGE

This is a continuation of copending application Ser. No. 07/572,280 filed on Jul. 16, 1990 now abandoned.

BACKGROUND OF THE INVENTION

1. Field of the Invention

This invention relates to a process for depositing a doped layer of polysilicon over a stepped surface of a semiconductor wafer. More particularly, this invention relates to a process wherein polysilicon can be deposited over a stepped surface of a semi-conductor wafer in a manner which will provide a doped polysilicon layer having the deposition profile of an undoped polysilicon.

2. Description of the Related Art

In the construction of integrated circuit structures on semiconductor wafers, trenches may be formed in the wafer, or raised lines (steps) may be formed over the surface of the wafer, either of which, for example, can result in an uneven or stepped surface on the wafer with low areas corresponding to the location of such trenches or regions between raised lines. It is sometimes desirable to form a doped layer of polysilicon over such a stepped surface, for example, to form a conductive line over or between oxide-covered steps, or to fill an oxide-coated trench with a conductor to form a capacitor.

It is usually desirable to completely fill up such low areas between raised portions on the wafer, when depositing a layer such as polysilicon thereon. Unfortunately, this is difficult to accomplish with a doped polysilicon since doped polysilicon tends to deposit faster on horizontal surfaces than on vertical surfaces. The result has been the formation of a thick layer of doped polysilicon over the raised portions of the integrated circuit structure, e.g., on top of the steps or on the horizontal wafer surfaces adjoining a trench, while the low areas remain partially unfilled.

This s shown in FIG. 1, which illustrates such a prior art deposition of doped polysilicon over a stepped surface of a semiconductor wafer. As shown therein, the doped polysilicon 16 horizontally deposited on the top surface 12 of oxide layer 6 formed over step 10 on wafer 2 is thicker than the doped polysilicon 18 deposited vertically on the sidewall surfaces 14 of oxide layer 6 on step 10. Polysilicon 16' formed over the oxide-coated horizontal bottom surface of trench 20 in wafer 2 is similarly deposited thicker than the vertically deposited polysilicon 18' on the sidewalls of trench 20 in the prior art structure of FIG. 1.

The result of such uneven deposition of doped polysilicon is that if the low region is to be completely filled, the entire structure must either be deposited to a greater thickness, with high portions of the resulting polysilicon layer then removed in a separate step.

It would, therefore, be desirable to provide a process wherein a layer of doped polysilicon could be deposited which would completely fill low segments between raised portions on a semiconductor wafer, i.e., would have the deposition characteristics and resulting profile of an undoped polysilicon layer.

SUMMARY OF THE INVENTION

It is, therefore, an object of this invention to provide a process for depositing doped polysilicon over a stepped surface in a semiconductor wafer which will fill low segments between raised portions on the wafer.

It is another object of this invention to provide a process for depositing doped polysilicon over a stepped surface in a semiconductor wafer which will fill low segments between raised portions on the wafer by alternately depositing doped polysilicon and undoped polysilicon on the stepped surface of the wafer.

It is still another object of this invention to provide a process for depositing doped polysilicon over a stepped surface in a semiconductor wafer which will fill low segments between raised portions on the wafer by alternately depositing doped polysilicon and undoped polysilicon on the stepped surface of the wafer, wherein the doped polysilicon is deposited for a total length of time which is at least about as long as the deposition time for the undoped polysilicon.

It is yet another object of this invention to provide a process for depositing doped polysilicon over a stepped surface in a semiconductor wafer which will fill low segments between raised portions on the wafer by alternately depositing doped polysilicon and undoped polysilicon on the stepped surface of the wafer, wherein the doped polysilicon is deposited for a total length of time of from about at least as long as the deposition time for the undoped polysilicon up to about 3 times the deposition time for the undoped polysilicon.

It is a further object of this invention to provide a process for depositing a layer of doped polysilicon of from about 1500 to about 5000 Angstroms over a stepped surface in a semiconductor wafer which will fill low segments between raised portions on the wafer by alternately depositing doped polysilicon and undoped polysilicon on the stepped surface of the wafer, wherein the doped polysilicon is deposited for a total length of time of from about at least as long as the deposition time for the undoped polysilicon up to about 3 times the deposition time for the undoped polysilicon, followed by the step of annealing the deposited polysilicon layer to evenly distribute the dopant throughout the entire deposited polysilicon layer These and other objects of the invention will be apparent from the following description and accompanying drawings.

BRIEF DESCRIPTION OF THE DRAWINGS

FIG. 10 is a flowsheet illustrating the process of the invention.

BRIEF DESCRIPTION OF THE INVENTION

The process of the invention provides for the formation of a doped layer of polysilicon over a stepped surface of a semiconductor wafer in a manner which will result in the substantial filling of the low segments or areas adjacent raised portions of the wafer, by using sequential deposition steps of depositing doped and undoped polysilicon followed by an annealing step to uniformly distribute the dopant throughout the deposited polysilicon layer.

By use of the term "doped polysilicon layer" is meant a polysilicon layer having a concentration of dopant therein (which may comprise either N type or P type dopant, e.g., phosphorus, boron, arsenic) ranging from about $1\times10^{20}$ to about $2\times10^{21}$ atoms/cm$^3$. While the process may be used in the formation of either a P type or N type doped polysilicon layer over a stepped semiconductor wafer surface, by way of illustration, and not of limitation, the process will described in connection with the formation of a phosphorus-doped polysilicon layer.

In the use of the expression "low segments adjacent raised portions of the wafer" herein, the term "low segments" is intended to refer both to the volume within a trench, as well as to areas on the wafer between raised steps. The term "raised portions" is intended to refer both to those portions of the wafer adjacent such a trench, as well as to raised steps on the wafer surface.

Figure 1:
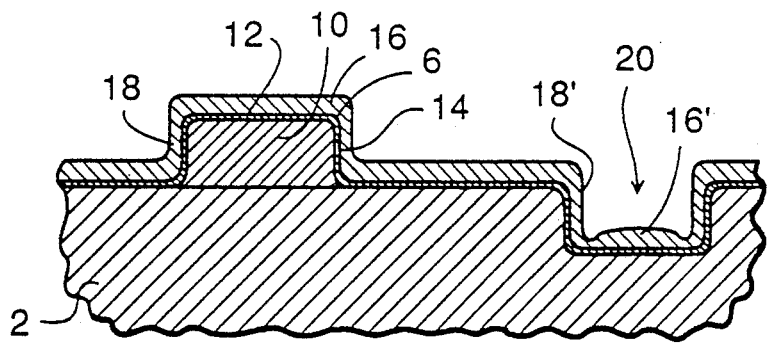
FIG. 1 is a fragmentary vertical cross-sectional view of a prior art deposition of a doped polysilicon layer over a stepped semiconductor wafer surface.
Figure 2:
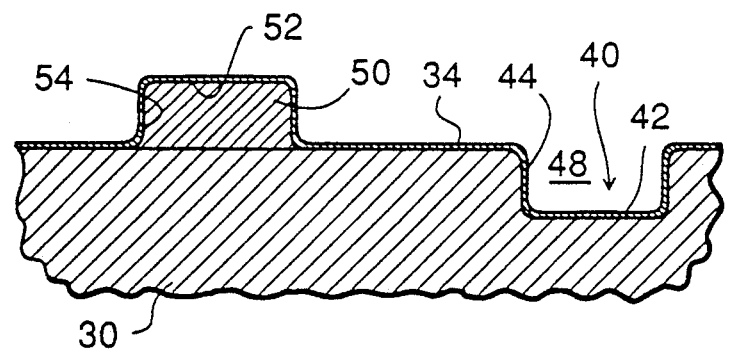
FIG. 2 is a fragmentary cross-sectional view of a semiconductor wafer shown with a raised step formed on its surface and a trench extending down into the wafer.

Now referring to FIG. 2, a semiconductor wafer 30 is shown having formed therein a trench 40, having a bottom wall surface 42 and sidewall surfaces 44, leaving an unfilled volume therein generally indicated at 48. Wafer 30 also has a raised step 50 formed thereof, having a top surface 52 and sidewall surfaces 54. As shown, an oxide coating 34 may be formed over the entire surface of wafer 30, including surfaces 42, 44, 52, and 54, respectively, in trench 40 and on step 50.

A first layer of doped polysilicon 60 is now formed over wafer 30 in a vacuum deposition chamber maintained at a pressure of from about 25 to about 200 Torr and a wafer temperature ranging from about 600° C. to about 700° C.

Figure 3:
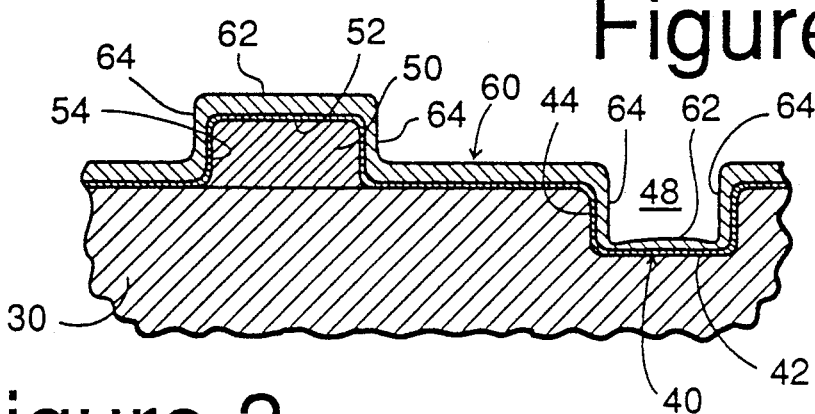
FIGS. 3–7 are sequential fragmentary vertical cross-sectional views showing the alternate deposition of doped and undoped polysilicon layers on the wafer of FIG. 2 using the deposition process of the invention.

The deposition is carried out by flowing a source of silicon, a source of dopant, and an optional carrier gas into the chamber to form first doped polysilicon layer 60, as shown in FIG. 3. This may be accomplished, for example, by flowing a source of silicon, such as silane (SiH$_4$), into the deposition chamber at a flow equivalent to from about 100 to about 1000 standard cubic centimeters/minute (sccm), typically about 500 sccm, through a 3 liter deposition chamber and a gaseous dopant mixture of 1 volume % PH$_3$ and 99 volume % H$_2$ flowing into the chamber at a flow rate equivalent to from about 200 to about 2000 sccm, typically about 1000 sccm, through a 3 liter deposition chamber.

Other materials can be utilized as sources of silicon in the practice of the method of the invention such as, for example, Si$_2$H$_6$.

Other dopant gases which may be used instead of PH$_3$, include, for example, BCl$_3$, B$_2$H$_3$, and AsH$_3$.

Optional carrier gases which may also be flowed into the deposition chamber during the polysilicon deposition process of the invention include Argon, Helium, and Nitrogen, typically at a flow rate, for a 3 liter deposition chamber, of from about 5000 to about 30 sccm.

This deposition step may be carried out for a time period of from about 20 seconds to about 2 minutes, typically about 45 seconds to about 1 minute, resulting in the structure shown in FIG. 3, with doped polysilicon layer 60 deposited thereon to an average thickness of from about 400 to about 800 Angstroms having thick portions 62 formed over horizontal surfaces, such as the horizontal top surface 52 of step 50 and on the horizontal bottom surface 42 of trench 40 and thinner portions 64 formed over vertical surfaces, such as sidewall surfaces 44 and 54.

Figure 4:
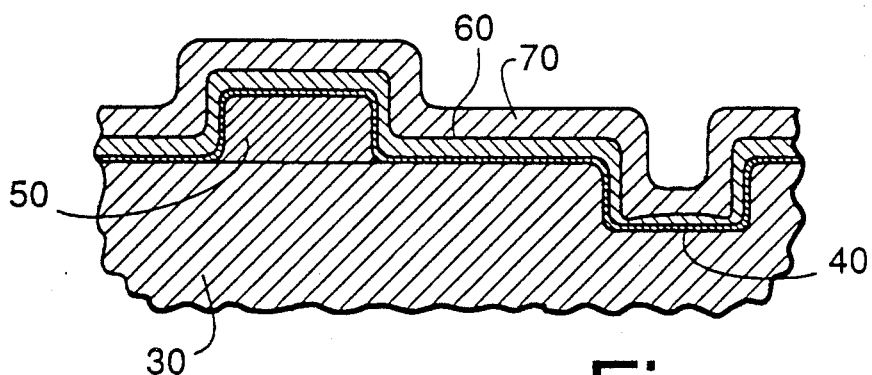

At this point in the process, the flow of the dopant source is shut off, while the source of silicon continues to flow into the deposition chamber resulting in the deposition of an undoped polysilicon layer 70 of substantially uniform thickness over doped polysilicon layer 60, as shown in FIG. 4. This deposition of undoped polysilicon may be continued for a time period of from about 20 seconds to about 1.5 minutes, preferably from about 45 to about 75 seconds, and typically about 1 minute, resulting in the deposition of an undoped polysilicon layer of from about 400 to about 800 Angstroms thick, after which the flow of dopant is again started resulting in the deposition of further doped polysilicon.

This cyclical deposition of doped and undoped polysilicon may be repeated additional times until the desired amount or thickness of polysilicon has been deposited on the stepped wafer surface, i.e., usually until the low areas or segments on the wafer between raised portions has been substantially filled with polysilicon.

Figure 5:
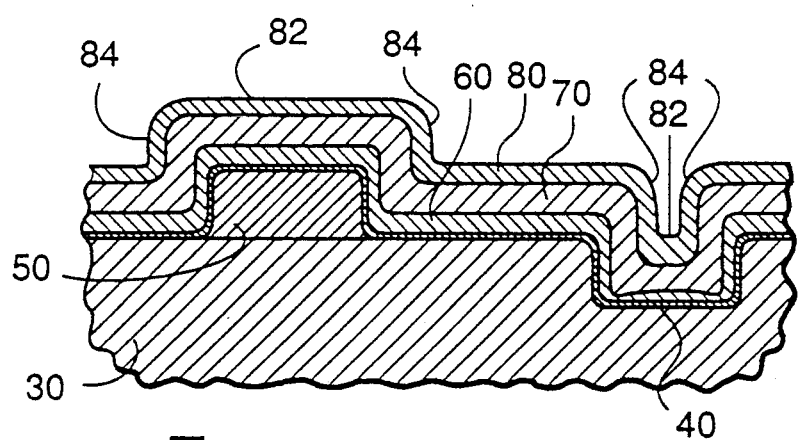
Figure 6:
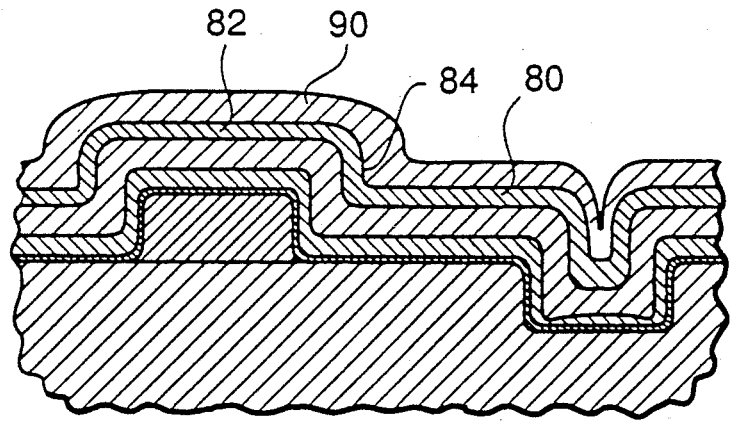
Figure 7:
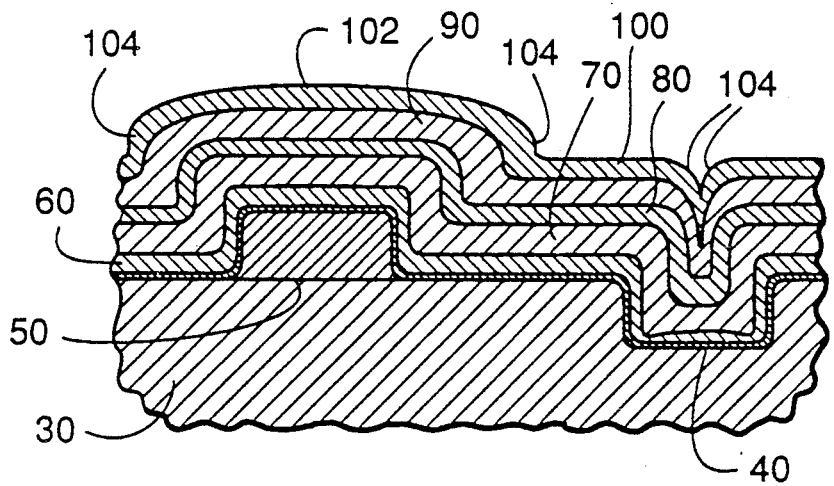

FIGS. 5-7 show step by step the deposition of a second doped polysilicon layer 80 with thick horizontal portions 82 and thinner vertical portions 84 (FIG. 5); the deposition of a second undoped polysilicon layer 90 of uniform thickness (FIG. 6); and the deposition of a third doped polysilicon layer 100 having thicker horizontal portions 102 and thinner vertical portions 104 (FIG. 7), although it will be noted that by this time the low regions or areas are filling up and rounding off so that the distinctions between vertical and horizontal surfaces are not as pronounced.

The deposited polysilicon is then annealed at a temperature within a range of from about 850° C. to about 1000° C. for a period of from 10 minutes to about 1 hour. Alternatively, the anneal may be carried out as a rapid thermal anneal wherein the temperature is rapidly raised to the desired annealing temperature stated above at a rate of from about 50° C./second up to about 100° C./second, and then maintained at this temperature for from 10 to 60 seconds. This annealing step uniformly distributes the dopant throughout the deposited polysilicon, resulting in the formation of a single homogeneously doped polysilicon layer.

Figure 8:
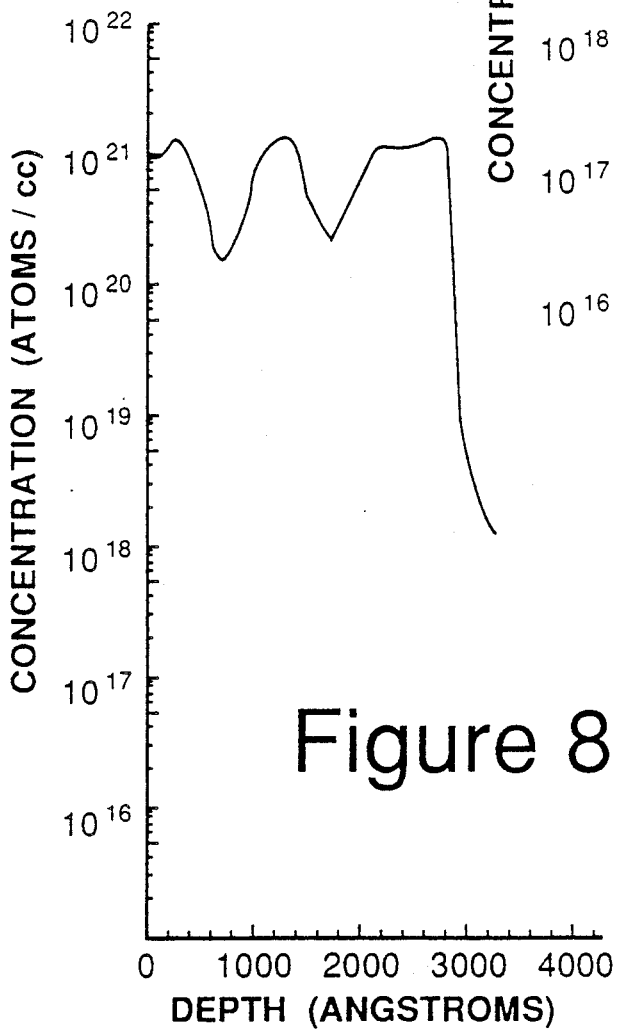
FIG. 8 is a graph plotting the concentration of dopant versus depth of the layer of polysilicon deposited on the stepped wafer by the process of the invention prior to annealing, showing the nonuniform distribution of the dopant in the deposited layer.

As shown in the SIMS graph of FIG. 8, which represents the dopant concentration levels in the polysilicon layer (layers) on the wafer versus depth, after completion of the polysilicon deposition, but prior to the annealing step, the dopant which is cyclically deposited with the polysilicon, initially is present only in those layers of polysilicon which were deposited while the dopant gas mixture was also flowing into the deposition chamber, i.e., polysilicon layers 60, 80, and 100, with the polysilicon layers deposited intermediate to such doped layers, i.e., layers 70 and 90, containing little if any dopant.

Figure 9:
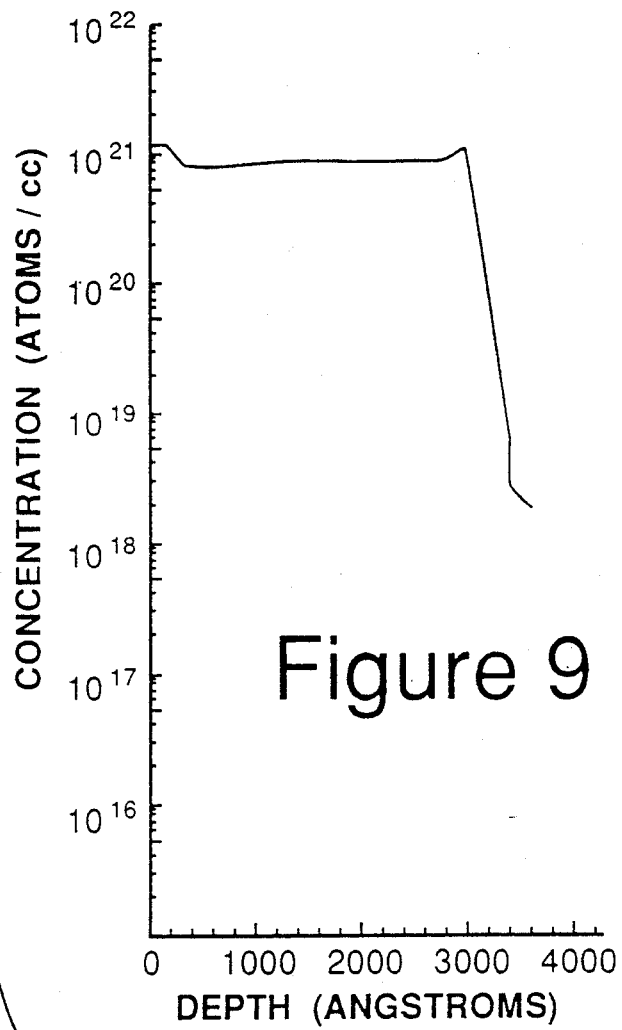
FIG. 9 is a graph plotting the concentration of dopant versus depth of the same layer of polysilicon deposited on the stepped wafer by the process of the invention as shown in the graph of FIG. 5, but after annealing, showing the uniform distribution of dopant throughout the deposited layer.

However, as shown in the SIMS graph of FIG. 9, which is performed on the wafer after the multiple layers of doped and undoped polysilicon have been annealed, the dopant is uniformly distributed throughout the entire layer of deposited and annealed polysilicon which now represent a single uniform and homogeneously doped polysilicon layer.

Thus, the process enables one to deposit a layer of polysilicon which will have a dopant content equal to that of a deposited doped polysilicon layer, yet have the deposition characteristics and profile of an undoped deposited polysilicon layer, i.e., will have a substantially uniform thickness of deposition on both the horizontal and vertical surfaces of the stepped wafer.

Having thus described the invention what is claimed is:

1. A process for forming a doped polysilicon layer over a stepped surface on a semiconductor wafer which comprises:
    a) depositing a layer of doped polysilicon having an average thickness of from about 400 to about 800 Angstroms on said stepped surface;
    b) depositing a layer of undoped polysilicon having an average thickness of from about 400 to about 800 Angstroms over said doped polysilicon;
    c) depositing a further amount of doped polysilicon over said undoped polysilicon; and
    d) rapidly annealing said deposited polysilicon by raising the temperature of said coated wafer to an annealing temperature of from about 850° C. to about 1000° C. at a rate of from about 50° C./second to about 100° C./second and then maintaining said wafer at said annealing temperature for a period of from about 10 seconds to about 60 seconds to uniformly distribute the dopant throughout the deposited polysilicon layer;

whereby said deposited polysilicon will comprise a doped polysilicon layer having the deposition profile of an undoped polysilicon layer over said stepped surface of said semiconductor wafer.

2. The process of claim 1 wherein steps a and b are each repeated at least one additional time to increase the thickness of the deposited layer of polysilicon.

3. The process of claim 1 wherein step a is carried out for a time period of from about 20 seconds to about 2 minutes.

4. The process of claim 1 wherein step a is carried out for a time period of from about 45 seconds to about 1 minute.

5. The process of claim 1 wherein step b is carried out for a time period of from about 20 seconds to about 1.5 minutes.

6. The process of claim 1 wherein step b is carried out for a time period of from about 45 seconds to about 1 minute.

7. A process for forming a doped polysilicon layer over a stepped surface on a semiconductor wafer in a vacuum deposition chamber which will fill low segments on the wafer surface adjacent raised portions of the wafer which comprises:
    a) flowing a source of silicon and a source of dopant into said chamber to deposit from about 400 to about 800 Angstroms of a first layer of doped polysilicon on said stepped surface;
    b) stopping the flow of said source of dopant into said chamber to deposit from about 400 to about 800 Angstroms of a first layer of undoped polysilicon over said doped polysilicon on said stepped surface of said wafer;
    c) restarting sad flow of said source of dopant into said chamber while continuing to flow said source of silicon into said chamber to deposit from about 400 to about 800 Angstroms of a second layer of doped polysilicon on said stepped surface;
    d) again stopping the flow of said source of dopant into said chamber to deposit from about 400 to about 800 Angstroms of a second layer of undoped polysilicon over said second layer of doped polysilicon on said stepped surface of said wafer; and
    e) rapidly annealing said deposited polysilicon by rapidly raising the temperature of said coated wafer to an annealing temperature of at least about 850° C. at a rate of from about 50° C./second to about 100° C./second, and then maintaining said wafer at said annealing temperature for a period of from about 10 seconds to about 60 seconds to uniformly distribute said dopant throughout the deposited polysilicon;

whereby said deposited polysilicon will comprise a doped polysilicon layer having the deposition profile of an undoped polysilicon layer over said stepped surface of said semiconductor wafer.

8. The process of claim 7 wherein said source of silicon is flowed into said chamber at a rate equivalent to from about 100 to about 1000 sccm into a 3 liter chamber.

9. The process of claim 8 wherein said source of silicon is a silane gas.

10. The process of claim 7 wherein said dopant is phosphorus.

11. The process of claim 10 wherein said phosphorus dopant comprises a mixture of about 1 volume % $PH_3$ and about 99 volume % $H_2$.

12. The process of claim 7 wherein steps a and b are each repeated at least one additional time to increase the thickness of the deposited layer of polysilicon.

13. The process of claim 7 wherein step a is carried out for a time period of from about 45 seconds to about 1 minute.

14. The process of claim 9 wherein step b is carried out for a time period of from about 45 seconds to about 1 minute.

15. The process of claim 7 wherein said vacuum chamber is maintained at a pressure within a range of from about 25 to about 200 Torr during said deposition steps.

16. The process of claim 7 wherein said wafer in said vacuum chamber is maintained at a temperature within a range of from about 600° C. to about 700° C. during said deposition steps.

17. A process for forming a doped polysilicon layer over a stepped surface on a semiconductor wafer in a vacuum deposition chamber which will fill low segments on the wafer surface adjacent raised portions of the wafer which comprises:
    a) flowing into said chamber for a time period of from about 20 seconds to about 2 minutes;
        i) a source of silicon selected from the class consisting of $SiH_4$ and $Si_2H_6$ at a flow rate equivalent to from about 100 to about 1000 sccm into a 3 liter chamber; and ii) a source of dopant selected from the class consisting of PH$_3$, B$_2$H$_3$, BCl$_3$, and AsH$_3$ into said chamber at a rate equivalent to from about 200 to about 2000 sccm into a 3 liter chamber;

to deposit a first layer of doped polysilicon on said stepped surface;

b) stopping the flow of said source of dopant into said chamber, while continuing the flow of said source of silicon into said chamber for a time period of from about 20 seconds to about 1.5 minutes to deposit a first layer of undoped polysilicon over said first layer of doped polysilicon on said stepped surface of said wafer;

c) flowing into said chamber for an additional time period of from about 20 seconds to about 2 minutes:
   i) a source of silicon selected from the class consisting of SiH$_4$ and Si$_2$H$_6$ at a flow rate equivalent to from about 100 to about 1000 sccm into a 3 liter chamber; and
   ii) a source of dopant selected from the class consisting of Ph$_3$, B$_2$H$_3$, BCl$_3$, and AsH$_3$ into said chamber at a rate equivalent to from about 200 to about 2000 sccm into a 3 liter chamber;

to deposit a second layer of doped polysilicon on said stepped surface;

d) again stopping the flow of said source of dopant into said chamber, while continuing the flow of said source of silicon into said chamber for an additional time period of from about 20 seconds to about 1.5 minutes to deposit a second layer of undoped polysilicon over said second layer of doped polysilicon on said stepped surface of said wafer; and e) rapidly annealing said deposited polysilicon by raising the temperature of the coated wafer to an annealing temperature of from about 850° C. to about 1000° C. by raising the temperature of said coated wafer to said annealing temperature at a rate of from about 50° C./second to about 100° C./second, and then maintaining said wafer at said annealing temperature for a period of from about 10 seconds to about 60 seconds to uniformly distribute said dopant throughout said deposited polysilicon;

whereby said deposited polysilicon will comprise a doped polysilicon layer having the deposition profile of an undoped polysilicon layer over said stepped surface on said semiconductor wafer.

18. The process of claim 17 wherein steps a and b are each repeated at least one additional time to increase the thickness of the deposited layer of polysilicon over said stepped wafer surface.

19. A process for forming a doped polysilicon layer over a stepped surface on a semiconductor wafer in a vacuum deposition chamber which will fill low segments on the wafer surface adjacent raised portions of the wafer which comprises:
   a) flowing a source of silicon into said chamber to deposit polysilicon on said stepped surface;
   b) intermittently flowing a source of dopant into said chamber with said source of silicon during said deposition of said polysilicon over said stepped surface of said wafer so that portions of said polysilicon depositing on said stepped surface comprise from about 400 to about 800 Angstroms of doped polysilicon and other deposited portions comprise from about 400 to about 800 Angstroms of undoped polysilicon;
   c) repeating said deposition of doped and undoped polysilicon on said stepped surface until at least two undoped layers, each having a thickness of from about 400 to about 800 Angstroms, and two doped layers, each having a thickness of from about 400 to about 800 Angstroms, are intermittently formed on said stepped surface; and
   d) then rapidly annealing said deposited doped and undoped polysilicon at a temperature of at least about 850° C. by raising the temperature of the coated wafer to said annealing temperature at a rate of from about 50° C./second to about 100° C./second, and then maintaining the wafer at said annealing temperature for a period of from about 10 seconds to about 60 seconds to uniformly distribute said dopant throughout the deposited polysilicon layers, whereby said deposited polysilicon layers will form a single uniformly doped polysilicon layer having the deposition profile of an undoped polysilicon layer over said stepped surface on said semiconductor wafer.

20. The process of claim 7 wherein steps c and d are each repeated at least one additional time to increase the thickness of the deposited layer of polysilicon.

* * * * *